US010490498B2

United States Patent
Yeh et al.

(10) Patent No.: US 10,490,498 B2
(45) Date of Patent: Nov. 26, 2019

(54) THREE-DIMENSIONAL SEMICONDUCTOR DEVICE WITH ISOLATED DUMMY PATTERN

(71) Applicant: MACRONIX INTERNATIONAL CO., LTD., Hsinchu (TW)

(72) Inventors: Teng-Hao Yeh, Hsinchu (TW); Min-Feng Hung, New Taipei (TW); Chih-Wei Hu, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 99 days.

(21) Appl. No.: 15/486,345

(22) Filed: Apr. 13, 2017

(65) Prior Publication Data

US 2018/0301407 A1    Oct. 18, 2018

(51) Int. Cl.
  *H01L 23/522*    (2006.01)
  *H01L 23/528*    (2006.01)
  *H01L 23/532*    (2006.01)

(52) U.S. Cl.
  CPC ........ *H01L 23/5226* (2013.01); *H01L 23/528* (2013.01); *H01L 23/5329* (2013.01); *H01L 23/53271* (2013.01)

(58) Field of Classification Search
  CPC .............. H01L 23/5226; H01L 23/528; H01L 23/53271; H01L 23/5329; H01L 27/11565; H01L 27/1157; H01L 27/11575; H01L 27/11582
  See application file for complete search history.

(56) References Cited

U.S. PATENT DOCUMENTS

| | | |
|---|---|---|
| 9,449,987 B1 | 9/2016 | Miyata et al. |
| 9,818,754 B2 * | 11/2017 | Fukuzumi ......... H01L 27/11565 |
| 2012/0168858 A1 | 7/2012 | Hong |
| 2016/0005752 A1 | 1/2016 | Kaneko et al. |
| 2016/0042111 A1 | 2/2016 | Chang |
| 2016/0163686 A1 | 6/2016 | Lee et al. |
| 2016/0260732 A1 | 9/2016 | Lue |

OTHER PUBLICATIONS

TW Office Action dated Dec. 5, 2017 in Taiwan application (No. 106112299).

* cited by examiner

*Primary Examiner* — Seahvosh Nikmanesh
(74) *Attorney, Agent, or Firm* — McClure, Qualey & Rodack, LLP

(57) ABSTRACT

A three-dimensional (3D) semiconductor device is provided, comprising: a substrate having a first area and a second area, and the second area adjacent to and surrounding the first area (i.e. active area), wherein an array pattern is formed in the first area; a stack structure having multi-layers formed above the substrate, and the multi-layers comprising active layers (ex: conductive layers) alternating with insulating layers above the substrate. The stack structure comprises first sub-stacks related to the array pattern in the first area; and second sub-stacks separately disposed in the second area, and the second sub-stacks configured as first dummy islands surrounding the first sub-stacks of the array pattern.

19 Claims, 17 Drawing Sheets

THREE-DIMENSIONAL SEMICONDUCTOR DEVICE WITH ISOLATED DUMMY PATTERN

BACKGROUND

Field of the Invention

The disclosure relates in general to a three-dimensional (3D) semiconductor device, more particularly to a 3D semiconductor device with isolated dummy pattern around an array pattern.

Description of the Related Art

In a conventional process for manufacturing a three-dimensional (3D) semiconductor device (such as a memory), a deep trench etching step is required to separate bit lines or word lines (ex: BL-to-BL or WL-to-WL). Before the deep trench etching step, multiple conductive layers are stacked on a base material (ex: on a substrate or inside a huge basement of the substrate), followed by the planarization process and deep trench etching process performed on the stacking multi-layers. During the period of the deep trench etching, the electrical charges of the plasma would be accumulated in the conductive layers, which induce defects of the structure of the 3D semiconductor device.

FIG. 1 is a top view of a conventional 3D semiconductor device. FIG. 2 is a cross-sectional view along a cross-sectional line 2A-2A of the conventional 3D semiconductor device of FIG. 1. A conventional 3D semiconductor device 1 comprises a substrate 10 having a first area A1 and a second area A2, and an array pattern $P_{array}$ is formed in the first area A1. A stack structure having multi-layers is formed above the substrate, wherein the multi-layers comprises several active layers 112 (ex: conductive layers, such as polysilicon layers) alternating with insulating layers 113 (ex: oxide layers) above the substrate 10. As shown in FIG. 2, those multi-layers extend to the regions outside the array pattern $P_{array}$, such as extending to a big-ring region $R_{BR}$ (between an OP boundary $B_{OP}$ and the array pattern $P_{array}$), and some of incomplete pattern of multi-layers would be remained in an isolation region $R_I$ (between the OP boundary $B_{OP}$ and an ADT boundary $B_{ADT}$ adjacent to a peripheral region $R_{Peri}$), wherein the big-ring region $R_{BR}$ and the isolation region $R_I$ are referred as a transitional region $R_T$. During the period of the deep trench etching, the electrical charges (symbol "e" as shown in FIG. 1) from the plasma would be accumulated in the conductive layers related to the big-ring region $R_{BR}$, which may have a high risk of arcing effect. The larger area of the big-ring region $R_{BR}$ is, the more serious arcing effect will be induced because a great number of electrical charges may gather at a certain weak location (ex: shape points or edges) to damage the structure of the 3D semiconductor device.

SUMMARY

The disclosure relates to a three-dimensional (3D) semiconductor device. According to the embodiment, a 3D semiconductor device with isolated dummy pattern around an array pattern prevents the arcing effect and significantly improves electrical characteristics of the 3D semiconductor device in application.

According to the present disclosure, a 3D semiconductor device is provided, comprising: a substrate having a first area and a second area, and the second area adjacent to and surrounding the first area (i.e. active area), wherein an array pattern is formed in the first area; a stack structure having multi-layers formed above the substrate, and the multi-layers comprising active layers (ex: conductive layers) alternating with insulating layers above the substrate. The stack structure comprises first sub-stacks related to the array pattern in the first area; and second sub-stacks separately disposed in the second area, and the second sub-stacks configured as first (multilayer-stacked) dummy islands surrounding the first sub-stacks of the array pattern.

The disclosure will become apparent from the following detailed description of the preferred but non-limiting embodiments. The following description is made with reference to the accompanying drawings.

DETAILED DESCRIPTION

Figure 1:
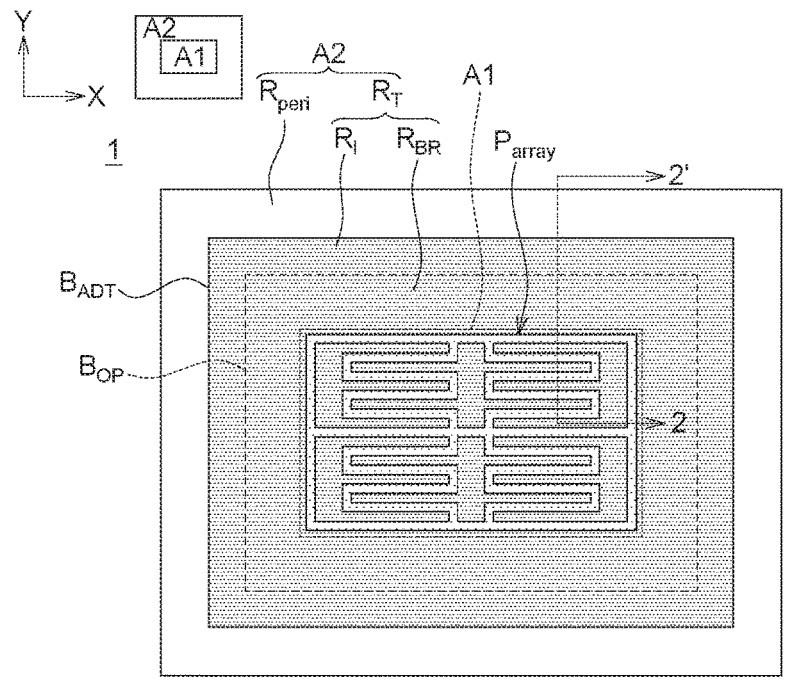
FIG. 1 (Prior Art) is a top view of a conventional 3D semiconductor device.
Figure 2:
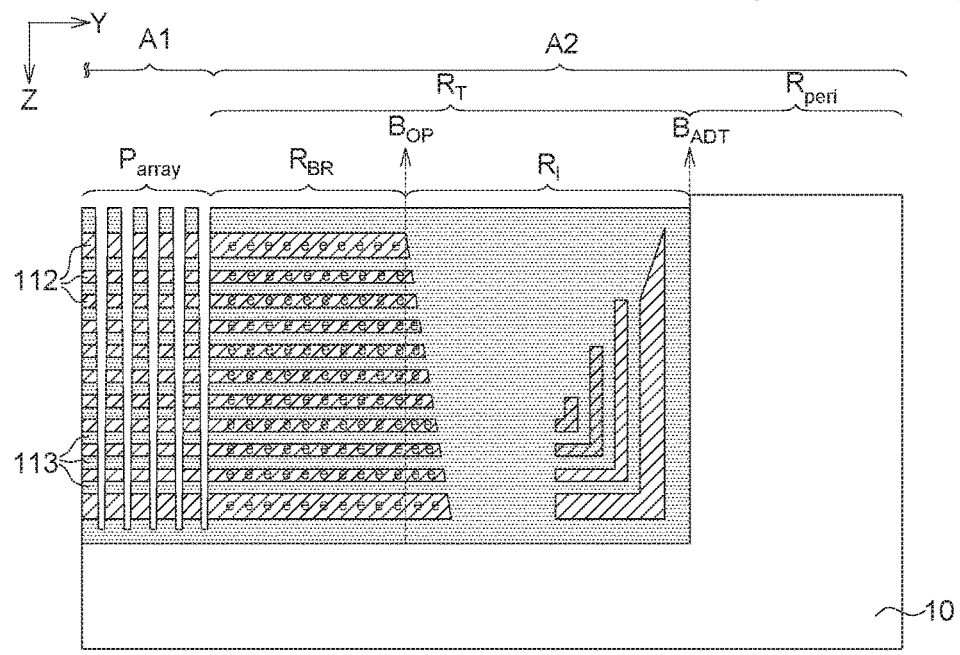
FIG. 2 (Prior Art) is a cross-sectional view along a cross-sectional line 2A-2A' of the conventional 3D semiconductor device of FIG. 1.

The embodiments of the present disclosure are disclosed below or elaborating a three-dimensional (3D) semiconductor device. According to the embodiments, a layout design with isolated dummy pattern (such as the net-like trench patterns, or the concentric trench patterns, or the all-around-pads pattern) surrounding the array pattern (active region) is proposed to decrease the area of floating conducting layers (ex: polysilicon layers), wherein at least the multilayers extending to the big-ring region $R_{BR}$ are divided into several isolated blocks, such as configured as several isolated dummy islands surrounding the sub-stacks of the array pattern, thereby greatly decreasing its capacity to store energy or electrical charges. Thus, the 3D semiconductor device with a pattern of dummy islands of the embodiment effectively reduces the capacities and areas for collecting and gathering undesired electrical charges at the conductive layers during the deep trench etching, no matter how many multilayers (ex: OP layers) stacked for the 3D semiconductor device. Therefore, the arcing effect (ex: particularly at the shape points or edges) could be relaxed; consequently, less damages occur and the electrical characteristics of the 3D semiconductor device in application would be greatly improved.

The disclosure can be applied to various applications with different cell arrays of 3D semiconductor devices, such as vertical-channel (VC) 3D semiconductor devices and vertical-gate (VG) 3D semiconductor devices, and there are no particular limitations to the application types of 3D semiconductor devices. Several embodiments are provided hereinafter with reference to the accompanying drawings for describing the related structural configurations and applicable processes. Related structural details such as dummy islands arrangement and modified designs are further described in the embodiments. However, the present disclosure is not limited to those illustrated in the drawings. It is noted that not all embodiments of the invention and the applications are shown. There may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

Figure 3:
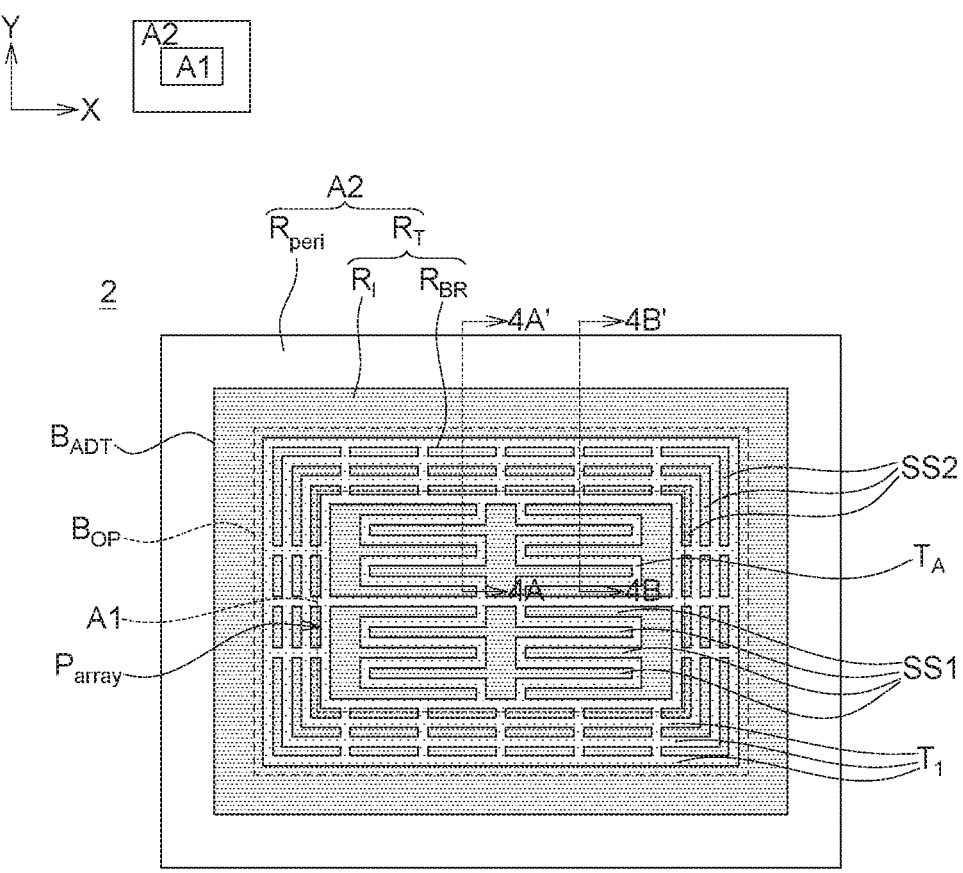
FIG. 3 is a top view of a 3D semiconductor device according to the first embodiment of the present disclosure.
Figure 4A:
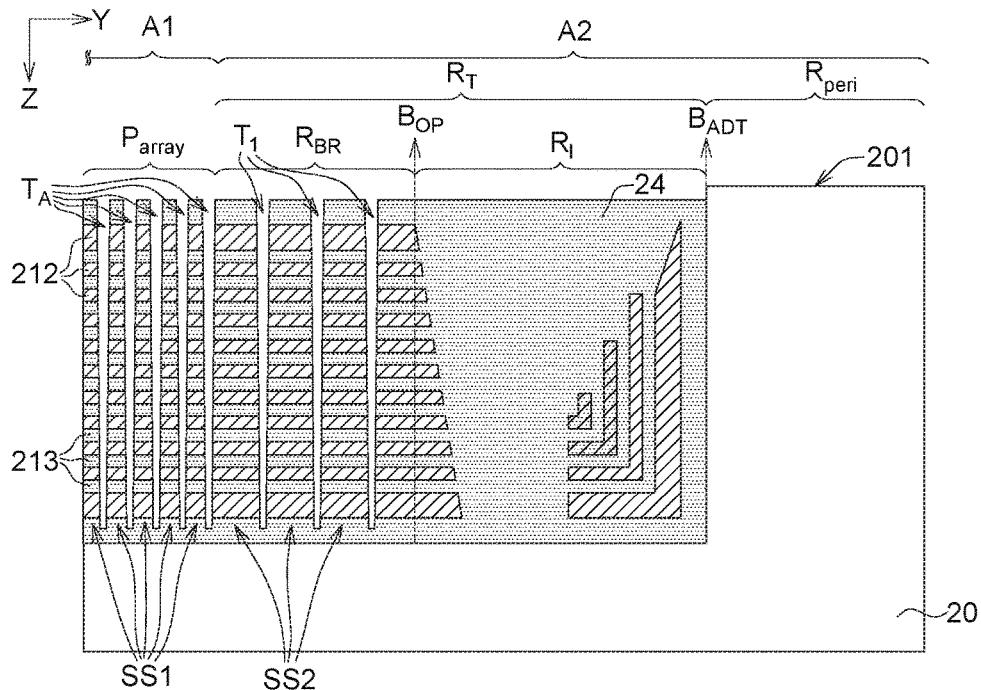
FIG. 4A is a cross-sectional view along a cross-sectional line 4A-4A of the 3D semiconductor device of FIG. 3.
Figure 4B:
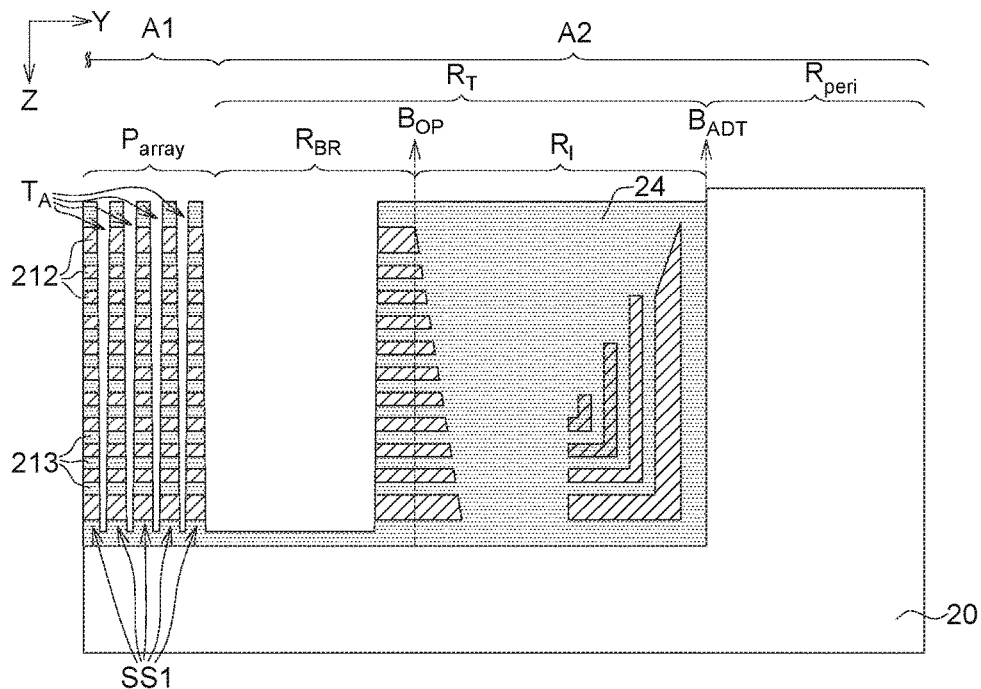
FIG. 4B is a cross-sectional view along a cross-sectional line 4B-4B' of the 3D semiconductor device of FIG. 3.

FIG. 3 is a top view of a 3D semiconductor device according to the first embodiment of the present disclosure. FIG. 4A is a cross-sectional view along a cross-sectional line 4A-4A' of the 3D semiconductor device of FIG. 3. FIG. 4B is a cross-sectional view along a cross-sectional line 4B-4B' of the 3D semiconductor device of FIG. 3. A 3D semiconductor device 2 according to the first embodiment comprises a substrate 20 having a first area A1 and a second area A2, wherein an array pattern $P_{array}$ is formed in the first area A1. A stack structure having multi-layers is formed above the substrate 20, and the multi-layers comprises several active layers 212 (ex: conductive layers, such as polysilicon layers) alternating with insulating layers 213 (ex: oxide layers) above the substrate 20. A stack structure comprises several first sub-stacks SS1 related to the array pattern $P_{array}$ in the first area A1, and several second sub-stacks SS2 separately disposed in the second area A2. According to the first embodiment, the second sub-stacks SS2 are configured as several first (multilayer-stacked) dummy islands (i.e. multilayer-stacked dummy islands) surrounding the first sub-stacks SS1 of the array pattern $P_{array}$.

According to one applicable embodiment, the second area A2 comprises a big-ring region $R_{BR}$ surrounding the array pattern $P_{array}$, an isolation region $R_I$ (ex: comprising an insulating layer 24 filling the position without conductive layers) surrounding the big-ring region $R_{BR}$, and a peripheral region $R_{Peri}$ surrounding the isolation region $R_I$. The big-ring region $R_{BR}$ is a region determined between an OP boundary $B_{OP}$ and the array pattern $P_{array}$. The isolation region $R_I$ is a region determined between the OP boundary $B_{OP}$ and an ADT (i.e. array deep trench) boundary $B_{ADT}$ adjacent to the peripheral region $R_{Peri}$. The peripheral region $R_{Peri}$ is a region outside the ADT boundary $B_{ADT}$ (ex: the un-concaved portion of the silicon substrate).

As shown in FIG. 4A and FIG. 4B, the multi-layers comprising the active layers 212 alternating with insulating layers 213 are extended to the regions outside the array pattern $P_{array}$, such as extended to the big-ring region $R_{BR}$, and some of incomplete pattern of multi-layers (due to the fabricating process) would be remained in an isolation region $R_I$, wherein the big-ring region $R_{BR}$ and the isolation region $R_I$ are referred as a transitional region $R_T$. As shown in FIG. 3 and FIG. 4A, the second sub-stacks SS2 configured as first (multilayer-stacked; ex: OP-stacked) dummy islands are separately disposed in the big-ring region $R_{BR}$ of the second area A2.

According to the first embodiment, at least the isolated first (multilayer-stacked) dummy islands are formed above the substrate 20 in the second area A2 (i.e. in the big-ring region $R_{BR}$) for surrounding the first sub-stacks SS1 of the array pattern $P_{array}$. Those first (multilayer-stacked; ex: OP-stacked) dummy islands form a dummy pattern in the big-ring region $R_{BR}$ of the second area A2 and greatly decreases the capacities of the active layers 212 (ex: conductive layers) related to the second area A2 to store energy or electrical charges, thereby effectively relaxing accumulation of electrical charges during deep etching step. Therefore, the arcing effect (ex: particularly at the shape points or edges) could be relaxed; consequently, less damages occur and the electrical characteristics of the 3D semiconductor device in application would be greatly improved.

Also, according to the embodiment, the first sub-stacks SS1 related to the array pattern $P_{array}$ in the first area A1 are separated by the array trenches $T_A$, and the second sub-stacks SS2 (i.e. the first (multilayer-stacked) dummy islands) are separated by the first trenches $T_1$. Noted that the first trenches $T_1$ are deep enough to cut the lowest polysilicon layer. As shown in FIG. 3, a layout of net-like trench pattern is adopted in the first embodiment, and the first trenches $T_1$ between those first (multilayer-stacked) dummy islands (i.e. SS2) communicate to each other from the top view. However, the present disclosure is not limited to the layout of net-like trench pattern of FIG. 3, and other applicable patterns of the first (multilayer-stacked) dummy islands (i.e. SS2) separated by the first trenches $T_1$ can be adopted (some of the applicable patterns are described later).

Additionally, the pitches between the first trenches $T_1$ can be the same or different. In one embodiment, the pitches between the first trenches $T_1$ can be varied with the distance apart from the array pattern $P_{array}$; for example, the pitches between the first trenches $T_1$ increase with the distance away from the array pattern $P_{array}$, depending on the conditions or modifications for meeting the requirements of the practical applications. Moreover, in one embodiment, the corners of the first (multilayer-stacked) dummy islands (i.e. SS2) have non-right angles, such as the corners of the first (multilayer-stacked) dummy islands are rounded, or rotated rather than 90 degree rotation to further prevent point discharge. Details of the pitch arrangements of the trenches and the corner shape of the dummy islands are described later.

Second Embodiment

In the second embodiment, a pattern of dummy islands is designed in relation to the big-ring region $R_{BR}$ and the isolation region $R_I$ of the second area A2.

Figure 5:
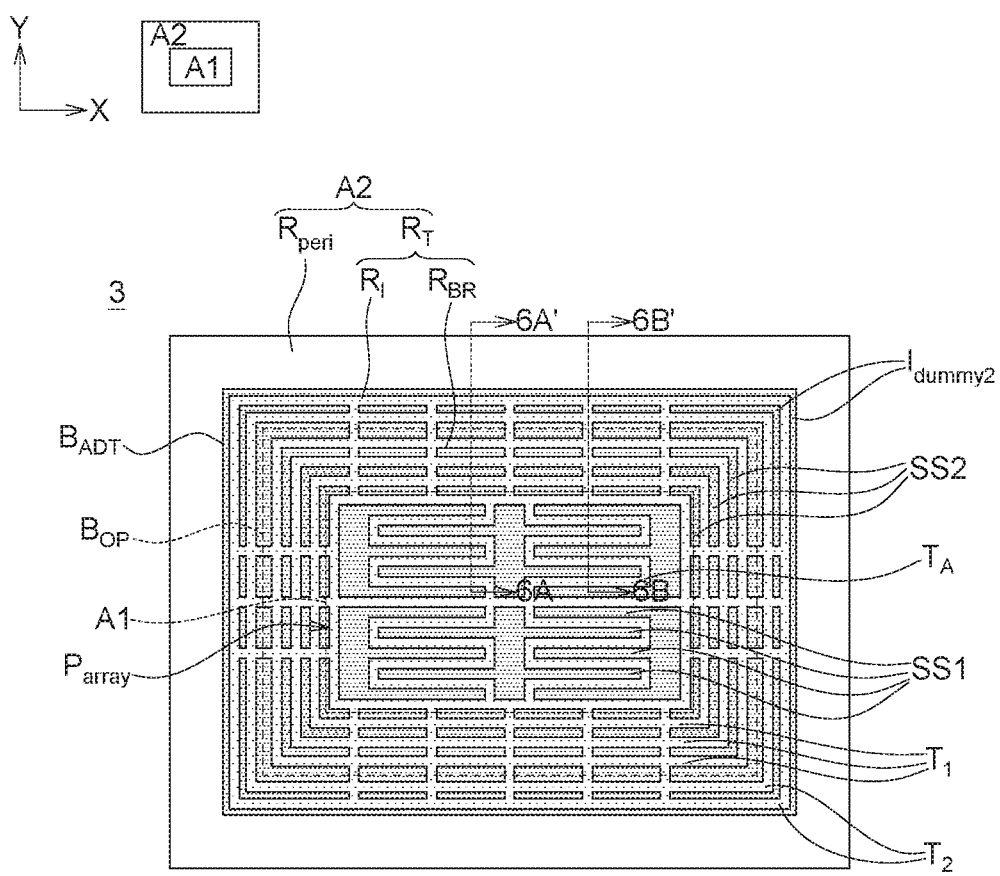
FIG. 5 is a top view of a 3D semiconductor device according to the second embodiment of the present disclosure.
Figure 6A:
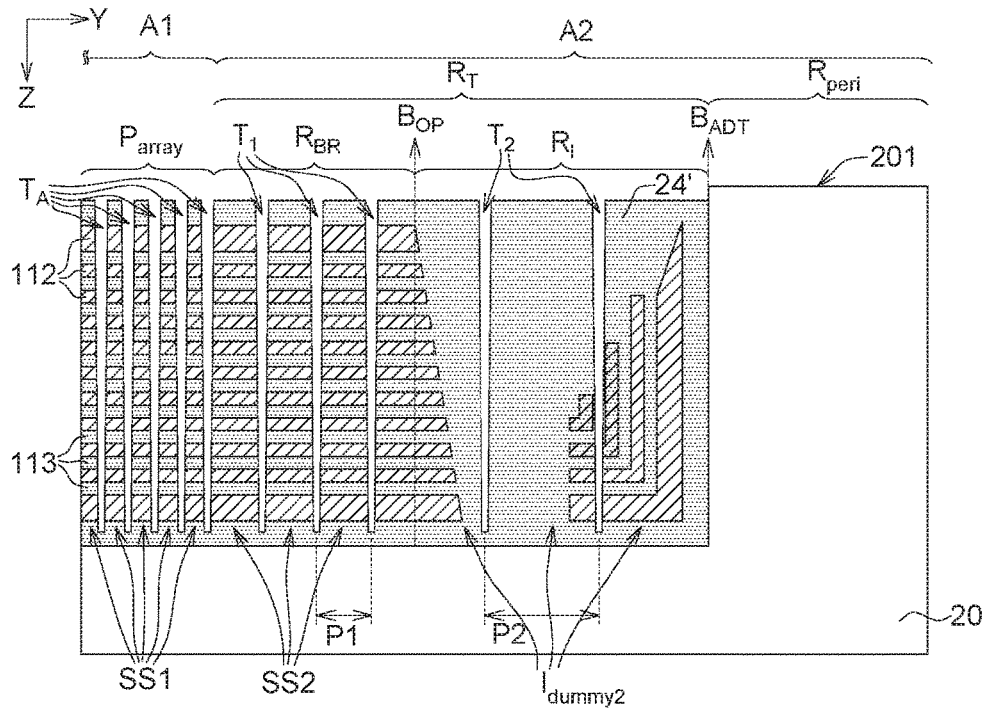
FIG. 6A is a cross-sectional view along a cross-sectional line 6A-6A of the 3D semiconductor device of FIG. 5.
Figure 6B:
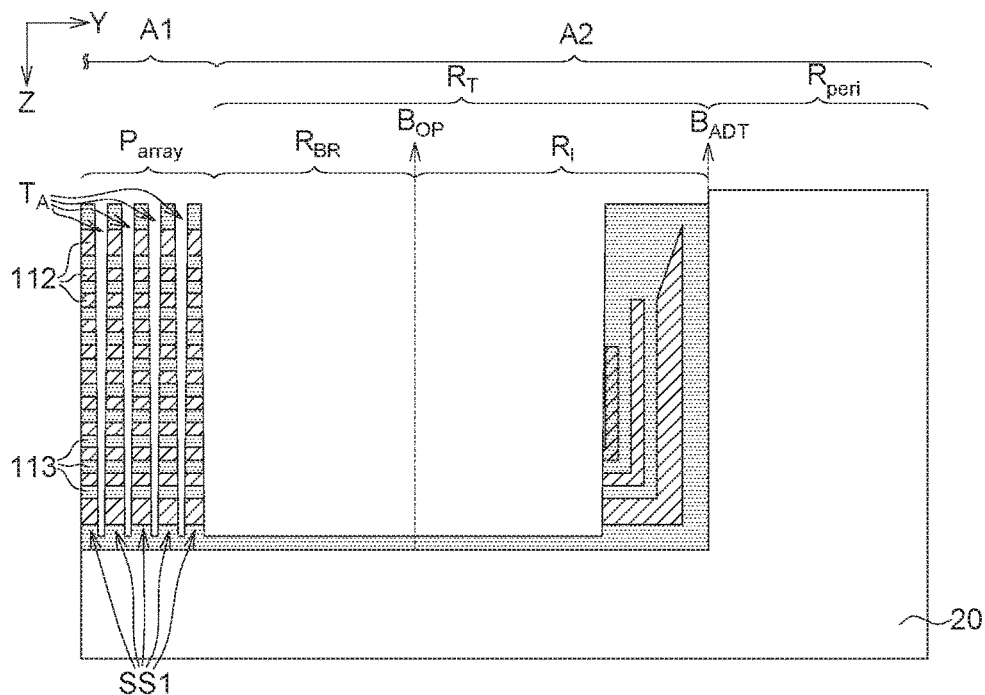
FIG. 6B is a cross-sectional view along a cross-sectional line 6B-6B' of the 3D semiconductor device of FIG. 5.

FIG. 5 is a top view of a 3D semiconductor device according to the second embodiment of the present disclosure. FIG. 6A is a cross-sectional view along a cross-sectional line 6A-6A of the 3D semiconductor device of FIG. 5. FIG. 6B is a cross-sectional view along a cross-sectional line 6B-6B' of the 3D semiconductor device of FIG. 5. Structures of the 3D semiconductor devices 2 and 3 of the first and second embodiments are identical, except for the 3D semiconductor device 3 of the second embodiments further comprises second dummy islands disposed above the substrate 20. Also, the identical and/or similar elements in the structures of FIGS. 5, 6A-6B and FIGS. 3, 4A-4B are designated with the same and/or similar reference numerals. Details of the configurations of the identical components/layers, such as layers, spatial arrangements and the first dummy islands (i.e. SS2), are not redundantly described.

Similarly, a 3D semiconductor device 3 according to the second embodiment comprises a substrate 20 having a first area A1 and a second area A2, wherein an array pattern $P_{array}$ is formed in the first area A1. The second area A2 comprises a big-ring region $R_{BR}$ surrounding the array pattern $P_{array}$, an isolation region $R_I$ surrounding the big-ring region $R_{BR}$, and a peripheral region $R_{Peri}$ surrounding the isolation region $R_I$. Besides the second sub-stacks SS2 configured as first (multilayer-stacked; ex: OP-stacked) dummy islands are separately disposed in the big-ring region $R_{BR}$ of the second area A2 as described in the first embodiment, the 3D semiconductor device 3 of the second embodiment further comprises several second dummy islands $I_{dummy2}$ disposed above the substrate 20 and positioned in the isolation region $R_I$, and the second dummy islands $I_{dummy2}$ surround the first (multilayer-stacked) dummy islands (i.e. SS2). Accordingly an insulating layer (ex: the insulating layer 24 in FIG. 4A) in the isolation region $R_I$ are cut into several split insulation islands to form a patterned insulating layer 24' in the isolation region $R_I$. Please see the first embodiment for the structural details of the first dummy islands (i.e. SS2).

Also, according to the second embodiment, the first sub-stacks SS1 related to the array pattern $P_{array}$ in the first area A1 are separated by the array trenches $T_A$, the second sub-stacks SS2 (i.e. the first (multilayer-stacked) dummy islands) are separated by the first trenches $T_1$ and the second dummy islands $I_{dummy2}$ are separated by the second trenches $T_2$. As shown in FIG. 5, in a layout of net-like trench pattern adopted in the second embodiment, the first trenches $T_1$ between those first (multilayer-stacked) dummy islands (i.e. SS2) and the second trenches $T_2$ between the second dummy islands $I_{dummy2}$ communicate to each other from the top view. However, the present disclosure is not limited to the layout of net-like trench pattern of FIG. 5, and other applicable patterns can be adopted.

Additionally, the pitches between the second trenches $T_2$ can be the same or different. In one embodiment, the pitches between the second trenches $T_2$ can be varied with the distance apart from the array pattern $P_{array}$; for example, the pitches between the second trenches $T_2$ can increase with the distance away from the array pattern $P_{array}$. Also, in one embodiment, the pitches (ex: the first pitches P1) between the first trenches $T_1$ can be smaller than the pitches (ex: the second pitches P2) between the second trenches $T_2$. Arrangements of the pitches (ex: P1, P2) can be modified or varied according to the conditions and the requirements of the practical applications. Moreover, in one embodiment, the corners of the second dummy islands $I_{dummy2}$ have non-right angles, such as being rounded, or rotated rather than 90 degree rotation.

Third Embodiment

In the third embodiment, a pattern of dummy islands is designed in relation to the big-ring region $R_{BR}$, the isolation region R and the peripheral region $R_{Peri}$ of the second area A2.

Figure 7:
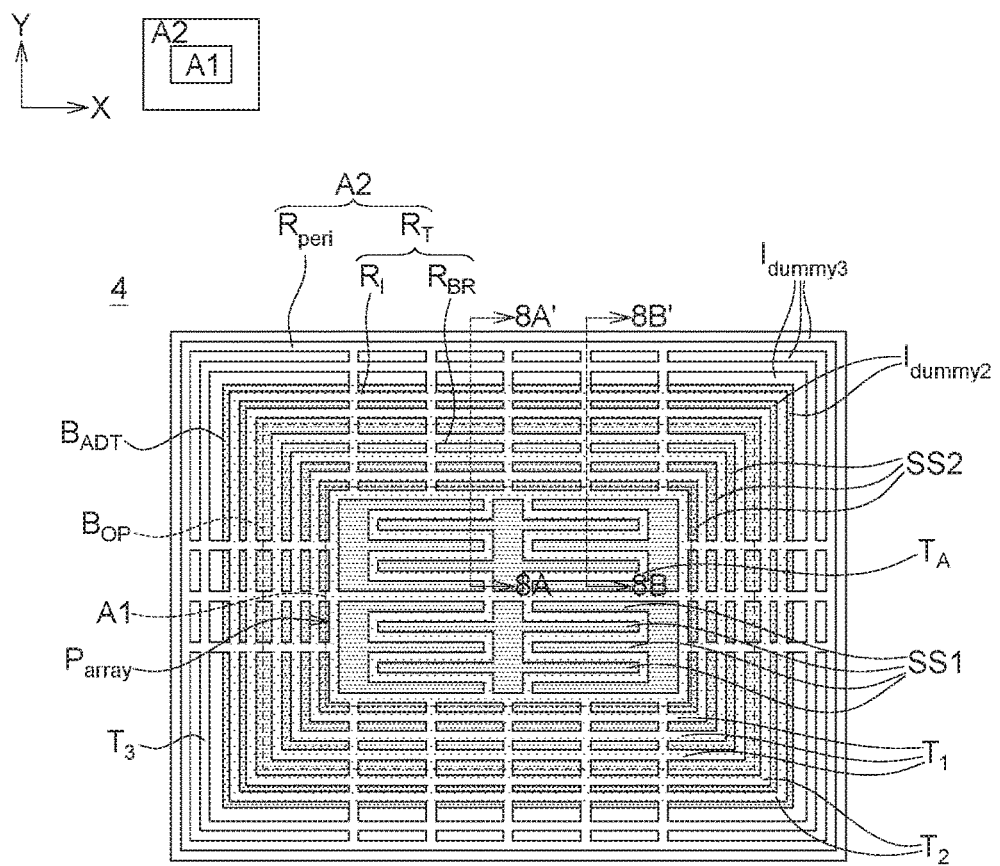
FIG. 7 is a top view of a 3D semiconductor device according to the third embodiment of the present disclosure.
Figure 8A:
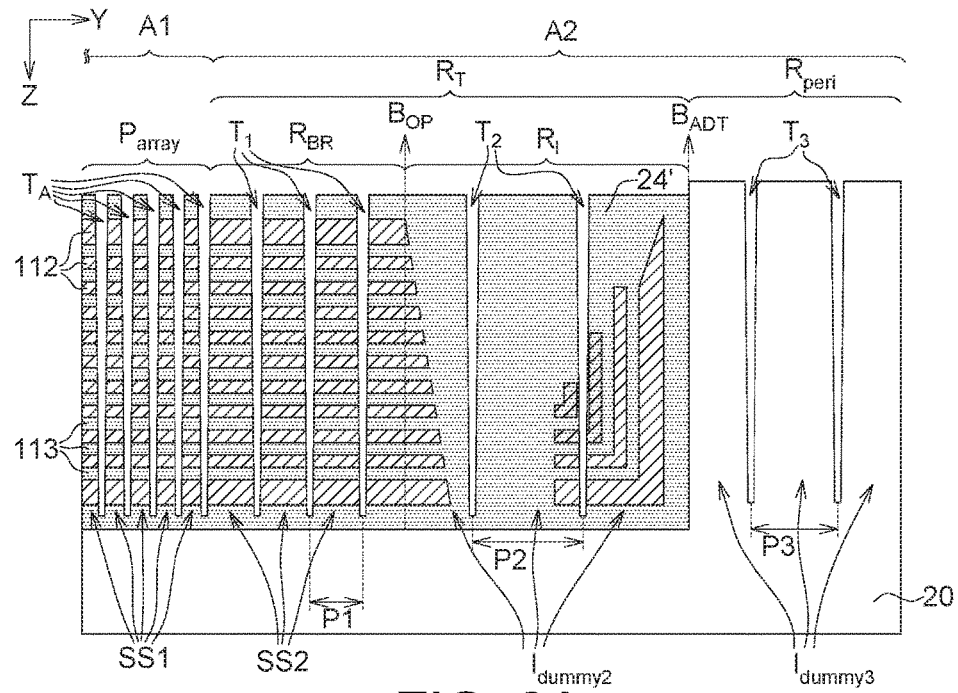
FIG. 8A is a cross-sectional view along a cross-sectional line 8A-8A' of the 3D semiconductor device of FIG. 7.
Figure 8B:
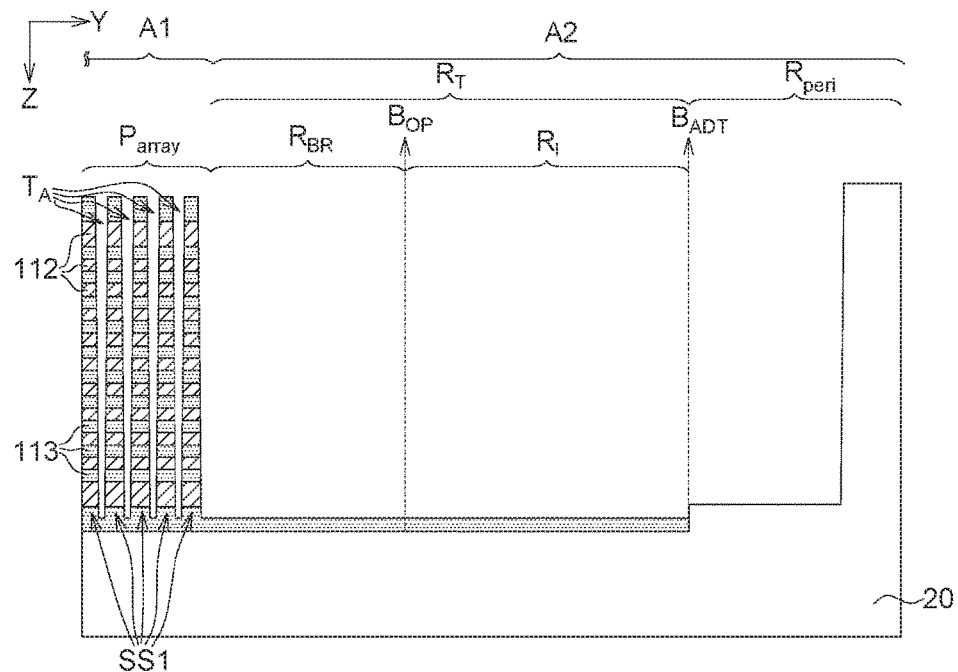
FIG. 8B is a cross-sectional view along a cross-sectional line 8B-8B' of the 3D semiconductor device of FIG. 7.
Figure 8C:
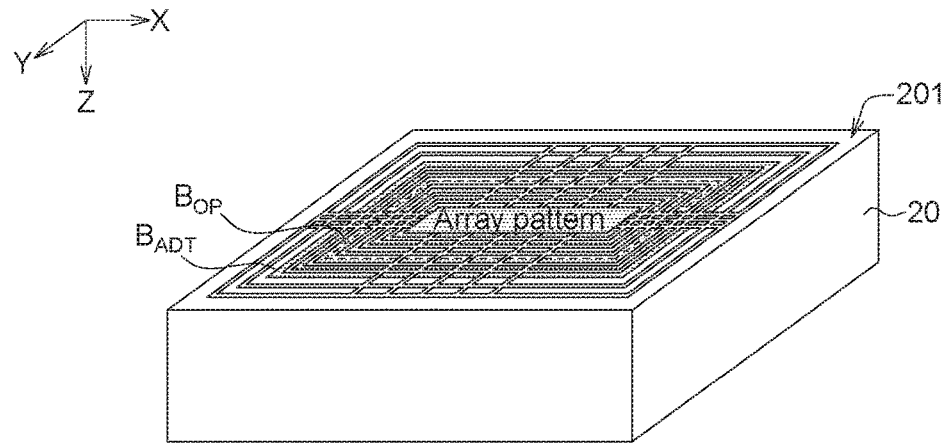
FIG. 8C is a perspective view of the 3D semiconductor device of FIG. 7.

FIG. 7 is a top view of a 3D semiconductor device according to the third embodiment of the present disclosure. FIG. 8A is a cross-sectional view along a cross-sectional line 8A-8A' of the 3D semiconductor device of FIG. 7. FIG. 8B is a cross-sectional view along a cross-sectional line 8B-8B' of the 3D semiconductor device of FIG. 7. FIG. 8C is a perspective view of the 3D semiconductor device of FIG. 7. Structures of the 3D semiconductor devices 3 and 4 of the second and third embodiments are identical, except for the 3D semiconductor device 4 of the third embodiments further comprises third dummy islands $I_{dummy3}$ disposed above the substrate 20. Also, the identical and/or similar elements in the structures of FIGS. 7, 8A-8B and FIGS. 5, 6A-6B are designated with the same and/or similar reference numerals. Details of the configurations of the identical components/layers, such as layers, spatial arrangements, the first dummy islands (i.e. SS2) and the second dummy islands $I_{dummy2}$, are not redundantly described.

In the third embodiment, besides the second sub-stacks SS2 configured as first (multilayer-stacked; ex: OP-stacked) dummy islands are separately disposed in the big-ring region $R_{BR}$ and the second dummy islands $I_{dummy2}$ are positioned in the isolation region as described in the second embodiment, several third dummy islands $I_{dummy3}$ are disposed above the substrate 20 and positioned in the peripheral region $R_{Peri}$, and the third dummy islands $I_{dummy3}$ surround the second dummy islands $I_{dummy2}$. Accordingly, not only the insulating layer (ex: 24 in FIG. 4A) in the isolation region $R_I$ are cut into several split insulation islands to form a patterned insulating layer 24', but also the silicon substrate 20 (extended from the top surface 201 downwardly) are cut into several split silicon islands. Please see the first and second embodiments for the structural details of the first dummy islands (i.e. SS2) and the second dummy islands $I_{dummy2}$.

Also, according to the third embodiment, the first sub-stacks SS1 related to the array pattern $P_{array}$ in the first area A1 are separated by the array trenches $T_A$, the first dummy islands (ex: SS2) are separated by the first trenches $T_1$, the second dummy islands $I_{dummy2}$ are separated by the second trenches $T_2$ and the third dummy islands $I_{dummy3}$ are separated by the third trenches $T_3$. As shown in FIG. 7, in a layout of net-like trench pattern adopted in the third embodiment, the first trenches $T_1$ between those first (multilayer-stacked) dummy islands (i.e. SS2), the second trenches $T_2$ between the second dummy islands $I_{dummy2}$ and the third trenches $T_3$ between the third dummy islands $I_{dummy3}$ communicate to each other from the top view. In one embodiment, the first trenches $T_1$, the second trenches $T_2$ and the third trenches $T_3$ have substantially the same depth. In FIG. 7, the layout of net-like trench pattern with isolated dummy islands surrounding the array pattern $P_{array}$ is adopted in the deep trench etching process, so that there is no big area of floating conductive layers (ex: polysilicon layers) to collect numerous electrical charges, thereby relaxing the arcing effect. It is noted that the present disclosure is not limited to the layout of net-like trench pattern of FIG. 7, and other applicable patterns can be adopted.

Additionally, the pitches between the third trenches $T_3$ can be the same or different. In one embodiment, the pitches between the third trenches $T_3$ can be varied with the distance apart from the array pattern $P_{array}$; for example, the pitches between the third trenches $T_3$ can increase with the distance away from the array pattern $P_{array}$. Also, in one embodiment, the pitches (ex: the first pitches P1) between the first trenches $T_1$ can be smaller than the pitches (ex: the second pitches P2) between the second trenches $T_2$, and the pitches (ex: the second pitches P2) between the second trenches $T_2$ can be smaller than the pitches (ex: the third pitches P3) between the third trenches $T_3$. Arrangements of the pitches (ex: P1, P2, P3) can be modified or varied according to the conditions and the requirements of the practical applications. Moreover, in one embodiment, the corners of the third dummy islands $I_{dummy3}$ have non-right angles, such as being rounded, or rotated rather than 90 degree rotation.

Figure 9A:
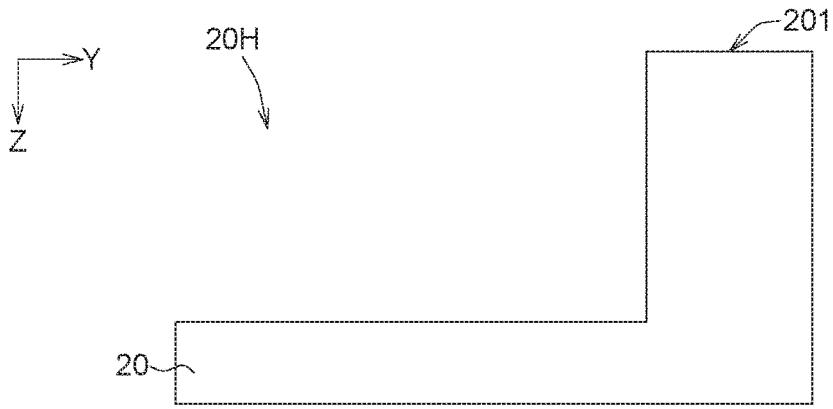
FIG. 9A-FIG. 9G depict a method of fabricating a 3D semiconductor device according to the third embodiment of the present disclosure.
Figure 9A:
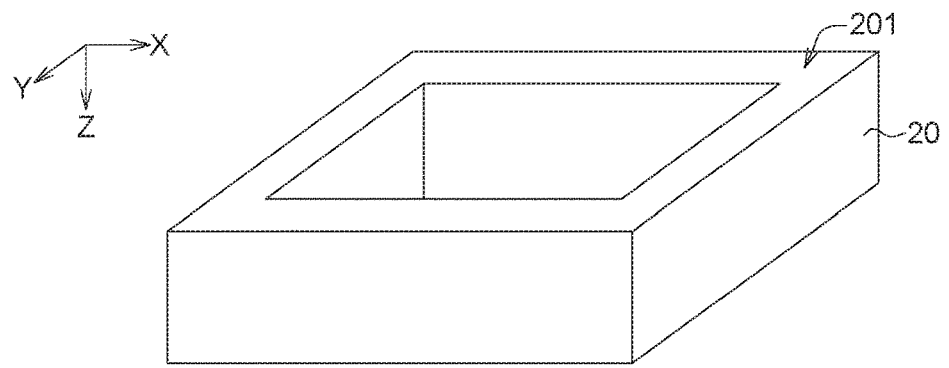
Figure 9B:
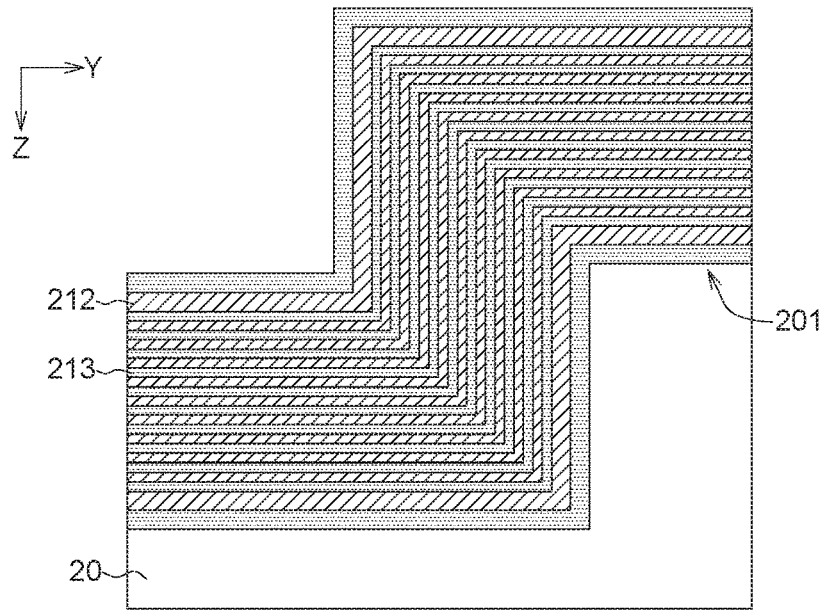
Figure 9C:
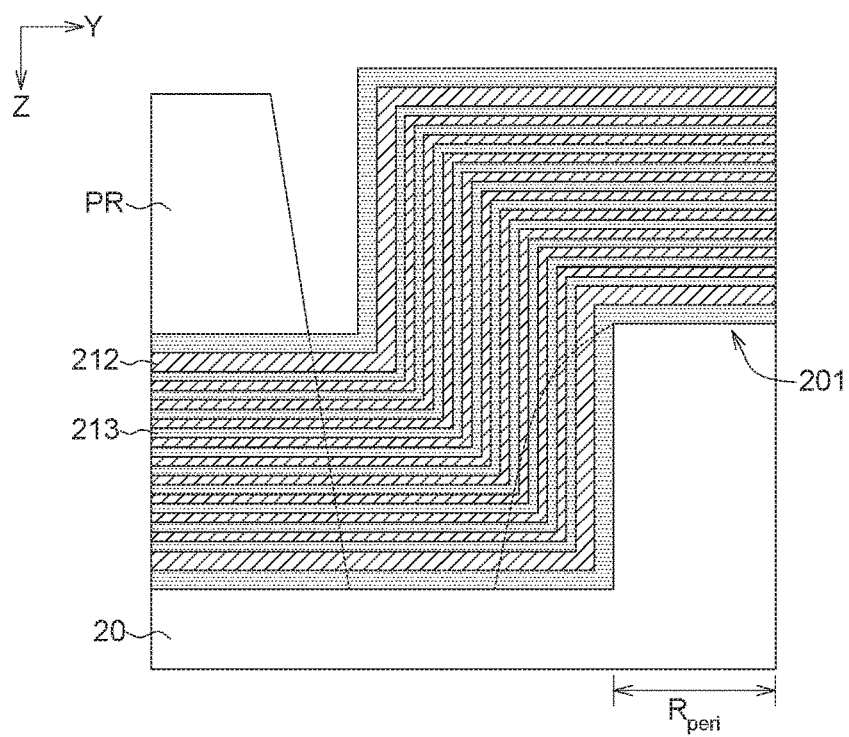
Figure 9D:
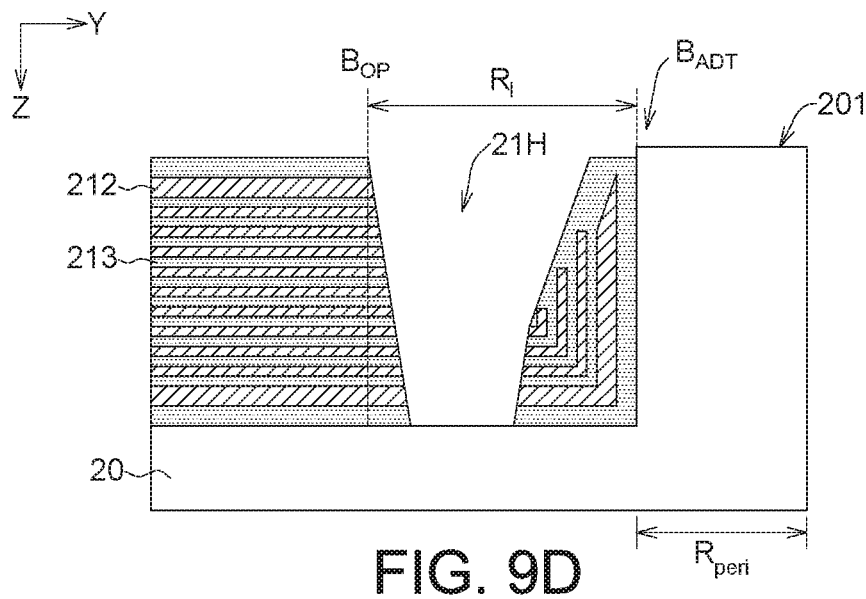

FIG. 9A-FIG. 9G depict a method of fabricating a 3D semiconductor device according to the third embodiment of the present disclosure. In FIG. 9A (a cross-sectional view) and FIG. 9A' (a perspective view of FIG. 9A), a big hole 20H is formed in a substrate 20 (ex: silicon substrate) by etching to form a huge "basement" before stacking the multiple films in relation to 3D memory, wherein the ADT (array deep trench) boundary $B_{ADT}$ is determined after forming the basement. This basement can accommodate various films to form 3D memory array without protruding the top surface 201 of the substrate 20. After forming the basement in the substrate 20, several multiple films of 3D memory structure, such as the active layers 212 (ex: polysilicon layers) alternating with insulating layers 213 (ex: oxide layers), are deposited layer by layer, as shown in FIG. 9B. In order to obtain a flat topology, those multiple films in the peripheral region $R_{Peri}$ are removed by etching back process. In FIG. 9O, a patterned photoresist PR is adopted to protect the multiple films related to the array region. After removing the multiple films above the top surface 201 of the substrate 20 related to the peripheral region $R_{Peri}$, a hole 21H in the isolation region $R_I$ is formed as shown in FIG. 9D, and the OP boundary $B_{OP}$ is determined.

Figure 9E:
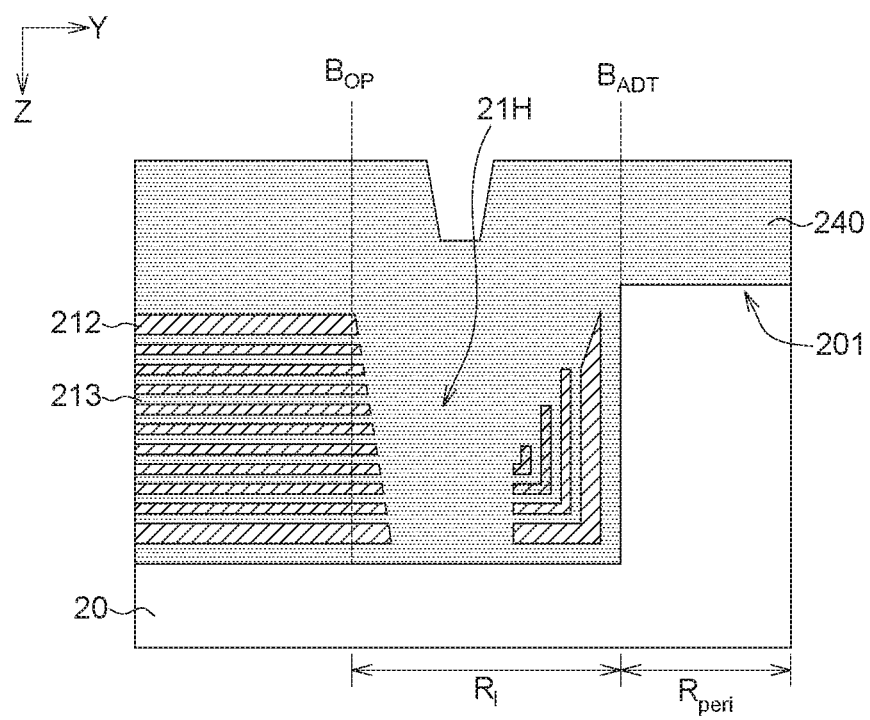
Figure 9F:
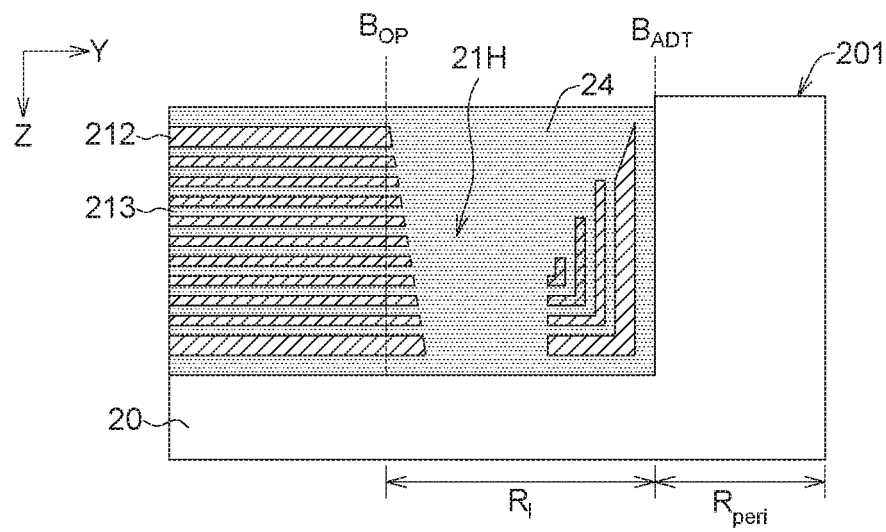
Figure 9F:
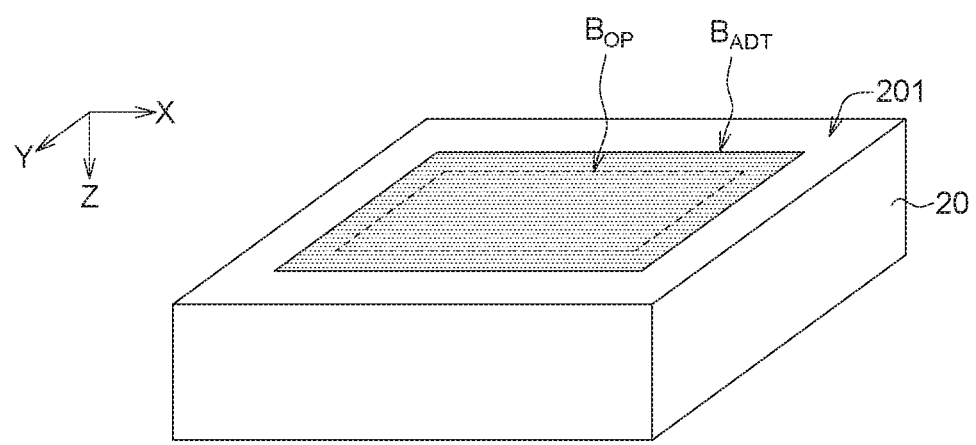
Figure 9G:
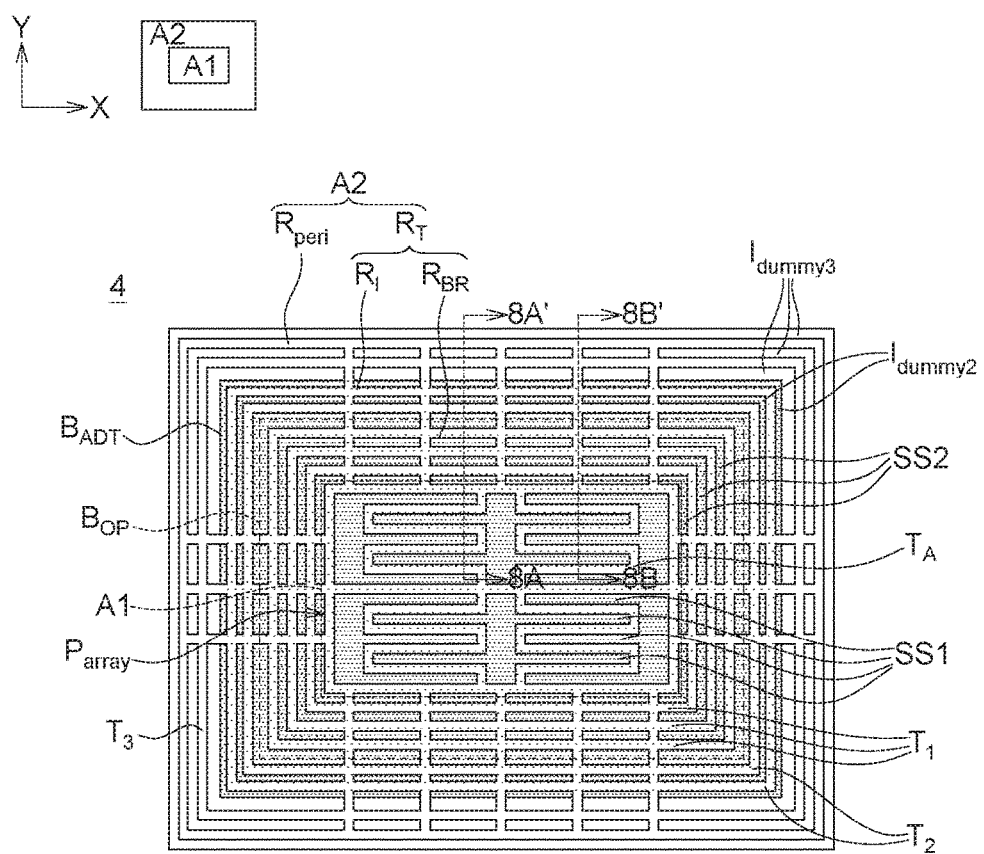

After array deep trench (ADT) planarization, the basement will be filled up by the multiple layers. The topmost layer of 3D memory films can be oxide acting as the buffer or protection. Additional oxide deposition as shown in FIG. 9E (ex: an insulating material layer 240 deposited on the multilayers and filling up the hole 21H in the isolation region $R_I$) and CMP procedures are needed to level off the topology between OP boundary and ADT boundary (ex: an insulating layer 24 covering the multilayers and filling the hole 21H) as shown in FIG. 9F. FIG. 9F' depicts a perspective view of FIG. 9F, which shows the basement is covered by an insulating layer 24. Afterwards, at least the array trenches $T_A$ in the first area A1 (for forming the first sub-stacks SS1 of the array pattern) and the first trenches $T_1$ in the big-ring region $R_{BR}$ are formed as described in the first embodiment. In one embodiment, the array trenches $T_A$, the first trenches $T_1$, the second trenches $T_2$ and the third trenches $T_3$ are formed, as shown in FIG. 9G (i.e. identical to the structure of FIG. 7). It is noted that the second trenches $T_2$ in the isolation region $R_I$ and the third trenches $T_3$ in the peripheral region $R_{Peri}$ are optionally formed depending on the requirements of practical applications.

It is noted that the layout of dummy islands according to the third embodiment is suitable for fabricating the memory devices within a "basement" of the silicon substrate; however, applications of the present disclosure are not limited to this basement-type substrate. In some applications, the memory devices are formed on the top surface of the silicon substrate without a "basement", and the applicable layout of dummy islands may comprise only the first dummy islands (ex: SS2) in the big-ring region $R_{Jk}$ and the second dummy islands $I_{dummy2}$ in the isolation region $R_I$ (i.e., no third dummy islands $I_{dummy3}$ in the peripheral region $R_{Peri}$).

Fourth Embodiment

Figure 10A:
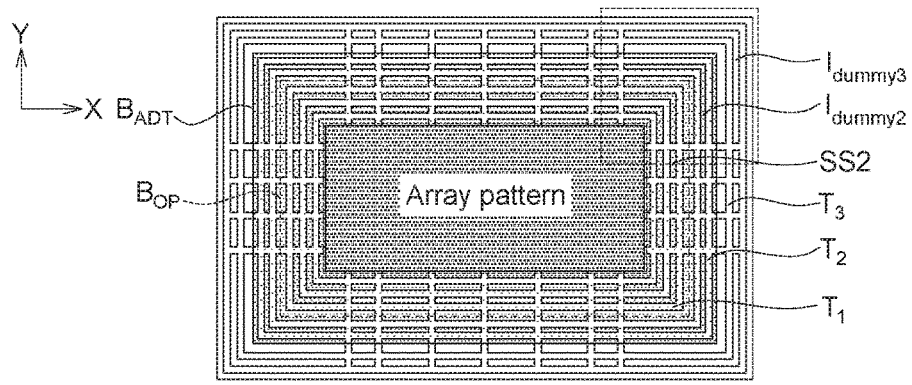
FIG. 10A is a top view of a 3D semiconductor device according to the fourth embodiment of the present disclosure.
Figure 10B:
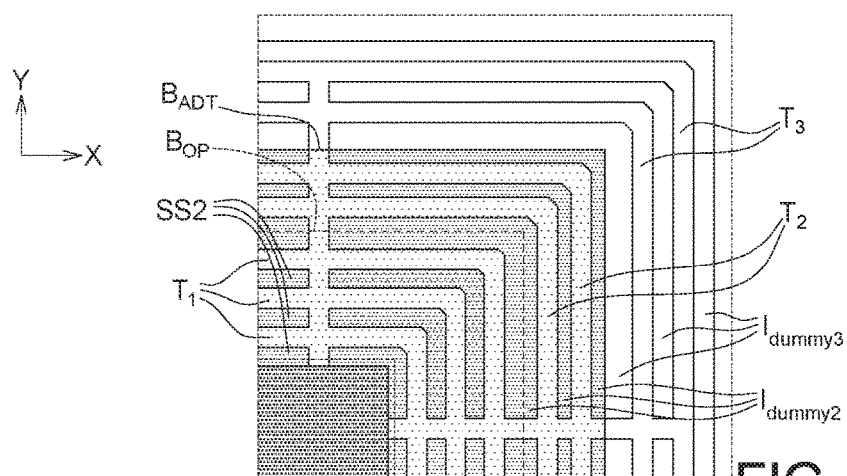
FIG. 10B is a top view of an enlarging portion of the 3D semiconductor device of FIG. 10A.
Figure 10C:
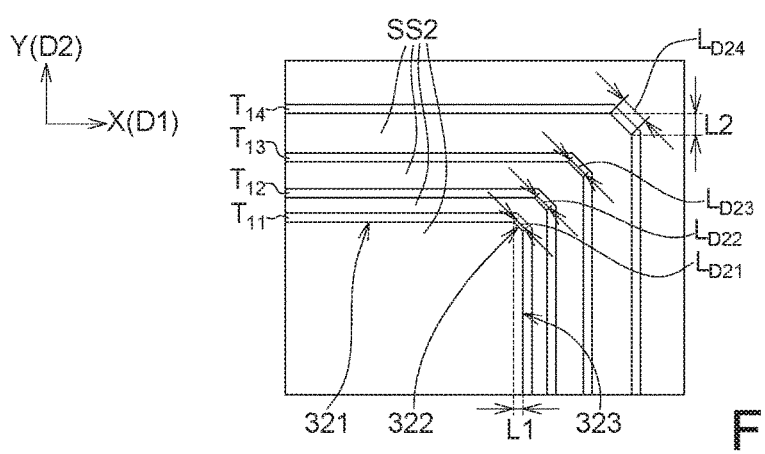
FIG. 10C is an enlarging drawing showing the corners of dummy islands according to the fourth embodiment.

In the fourth embodiment, arrangement with varied pitches of the trenches between the dummy islands formed in the second area A2 is provided for exemplifying (not for limiting) one of applications. FIG. 10A is a top view of a 3D semiconductor device according to the fourth embodiment of the present disclosure. FIG. 10B is a top view of an enlarging portion of the 3D semiconductor device of FIG. 10A. FIG. 10C is an enlarging drawing showing the corners of dummy islands according to the fourth embodiment.

The dummy trenches between dummy islands can be in either equal pitch or non-equal pitch (ex: gradually larger and larger with the distance away from the array pattern). Thus, the first pitches P1 between the first trenches $T_1$, the second pitches P2 between the second trenches $T_2$, and the third pitches P3 between the third trenches $T_3$ can be the same or different. In one embodiment, the pitches of dummy trenches are loosening gradually, while the trench width of the dummy trenches is kept the same. When nearing to the array pattern $P_{array}$; the pitches of dummy trenches are closed to the pitches of array trenches $T_A$ (ex: pitch of array trench $T_A$: 0.1-0.3 micrometers in one embodiment) for balancing the plasma charging effect. Far away the array region (i.e. near to the peripheral region), the trench-to-trench space is increased to about few micrometers since the peripheral region is the bulk silicon substrate and the plasma charges can be discharged to ground easily; therefore larger pitches of the trenches (i.e. the third trenches $T_3$) therein is closed to peripheral devices.

As shown in FIG. 10A and FIG. 10B, in one embodiment, the first pitches P1 between the first trenches $T_1$, the second pitches P2 between the second trenches $T_2$, and the third pitches P3 between the third trenches $T_3$ increase with the distance apart from the array pattern $P_{array}$. Also, in one embodiment, the first pitches P1 between the first trenches T$_1$ can be smaller than the second pitches P2 between the second trenches T$_2$, and the second pitches P2 between the second trenches T$_2$ can be smaller than the third pitches P3 between the third trenches T$_3$. Arrangements of the pitches (ex: P1, P2, P3) can be modified or varied according to the conditions and the requirements of the practical applications.

Moreover, in one embodiment, the corners of the first dummy islands (i.e. SS2), the corners of the second dummy islands I$_{dummy2}$, and the corners of the third dummy islands I$_{dummy3}$ have non-right angles. For example, the corners of those dummy islands (or the trenches) can be rounded, or rotated rather than 90 degrees rotation (ex: 45 degrees rotation) to prevent point discharge effect or local high electrical-field, as shown in FIG. 10B and FIG. 10C.

In one embodiment, the corner of each of the dummy islands is cut to generate a slanted side. As shown in FIG. 10C, it is assumed that four of the first trenches T$_{11}$, T$_{12}$, T$_{13}$ and T$_{14}$ are formed for defining the first dummy islands (i.e. SS2) surrounding an array pattern. One corner of one of the first dummy islands is defined by a first side 321 (extended along a first direction (D1) such as x-direction), a second side 322 and a third side 323 (extended along a second direction (D2) such as y-direction), and the second side 322 is positioned between and connecting the first side 321 and the third side 323, wherein the first side 321 is perpendicular to the third side 323, and the second side 322 is tilted to the first side 321 and the third side 323. In one embodiment, the second side 322 is tilted to the first side 321 or the third side 323 for any non-90 degrees such as about 45 degrees. Also, In one embodiment, the second side 322 has a first projection length L1 ranged from 0.1 μm to 100 μm along the first direction (D1) such as x-direction, and a second projection length L2 ranged from 0.1 μm to 100 μm along the second direction (D2) such as y-direction. Moreover, In one embodiment, the lengths of the titled second sides 322 of the first dummy islands (corresponding to the same corner of the array pattern), such as the lengths L$_{D21}$, L$_{D22}$, L$_{D23}$ and L$_{D24}$, are increased with a distance away from the same corner of the array pattern. That is, L$_{D21}$<L$_{D22}$<L$_{D23}$<L$_{D24}$.

Although the 3D semiconductor device according to the fourth embodiment is exemplified by forming a layout of net-like trench pattern surrounding the array pattern (active region) and extended to the peripheral region R$_{Peri}$ as shown in FIG. 10A, the pitch arrangement and corner design as disclosed herein can be applied to other layouts of trench pattern such as the layouts provided in the first and second embodiments.

Fifth Embodiment

In the first to fourth embodiments, the layouts of net-like trench patterns surrounding the array patterns (active region) are exemplified for illustration; however, the disclosure is not limited to those layouts of trench patterns or dummy island patterns, other layouts of trench patterns or dummy island patterns are applicable as long as formation of dummy islands capable of relaxing arcing effect. In the fifth embodiment, some of other applicable layouts are provided for the references. For example, the dummy islands (or the trenches) can be arranged as concentric circles, concentric rectangular rings, or a layout of pads (in rectangular shapes or square shapes) all around the array pattern.

Figure 11A:
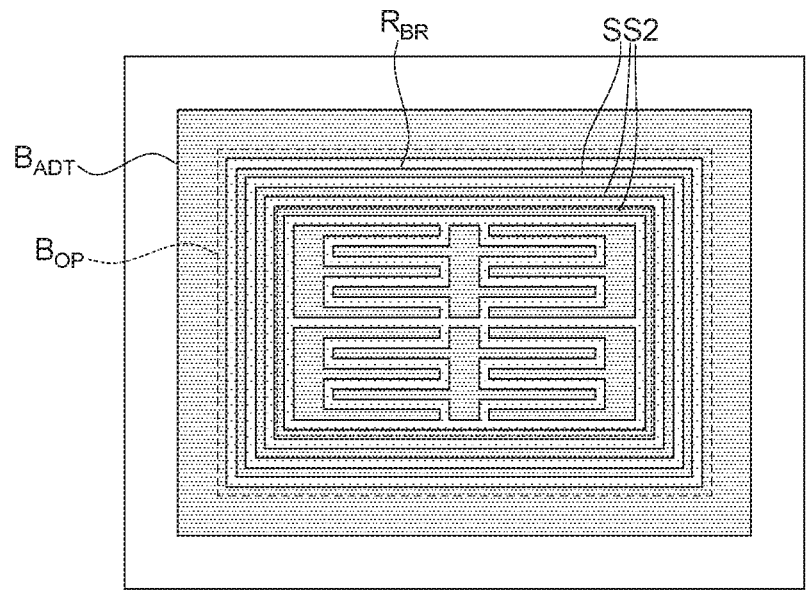
FIG. 11A is a top view of a 3D semiconductor device according to the fifth embodiment of the present disclosure.

FIG. 11A is a top view of a 3D semiconductor device according to the fifth embodiment of the present disclosure, which shows the first dummy islands (i.e. SS2)(or the trenches for defining the first dummy islands) in the big-ring region R$_{BR}$ are arranged as concentric rectangular rings surrounding the array pattern.

Figure 11B:
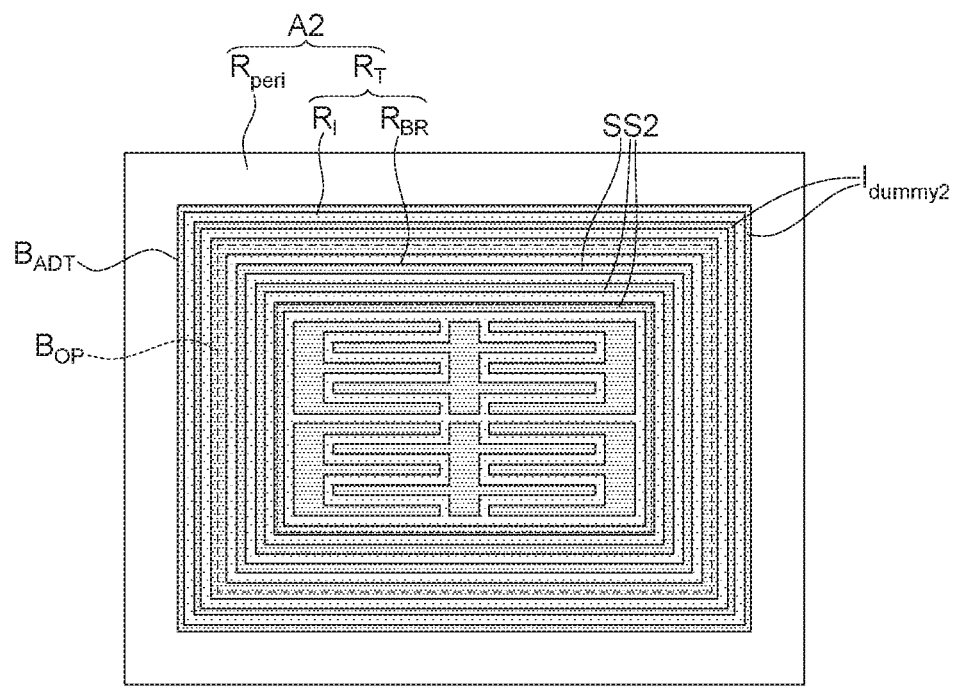
FIG. 11B is a top view of another 3D semiconductor device according to the fifth embodiment of the present disclosure.

FIG. 11B is a top view of another 3D semiconductor device according to the fifth embodiment of the present disclosure, which shows the first dummy islands (i.e. SS2) (or the trenches for defining the first dummy islands) in the big-ring region R$_{BR}$ and the second dummy islands I$_{dummy2}$ (or the trenches for defining the second dummy islands I$_{dummy2}$) in the isolation region R$_I$ are arranged as concentric rectangular rings surrounding the array pattern.

Figure 11C:
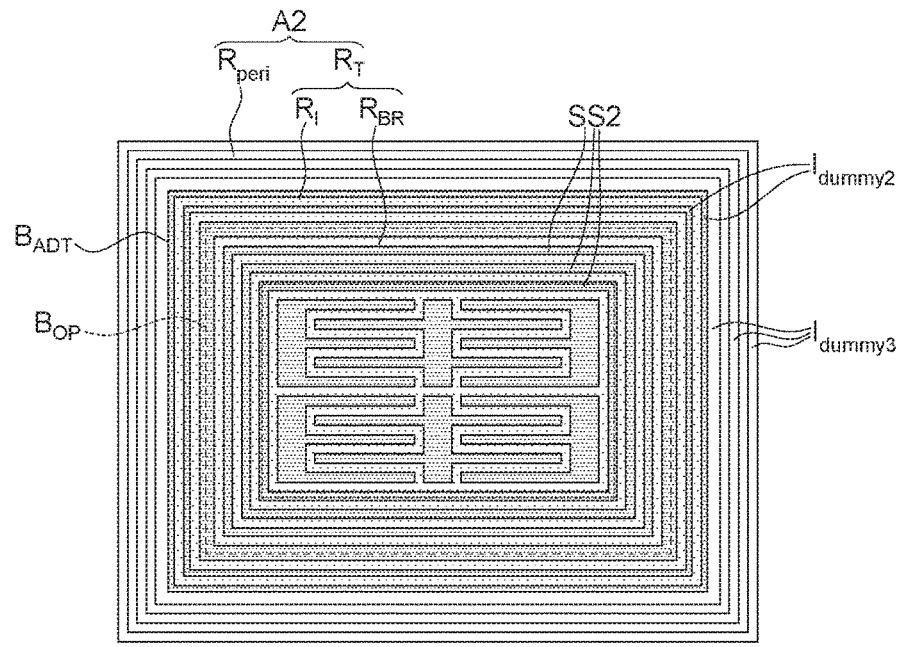
FIG. 11C is a top view of still another 3D semiconductor device according to the fifth embodiment of the present disclosure.
Figure 11D:
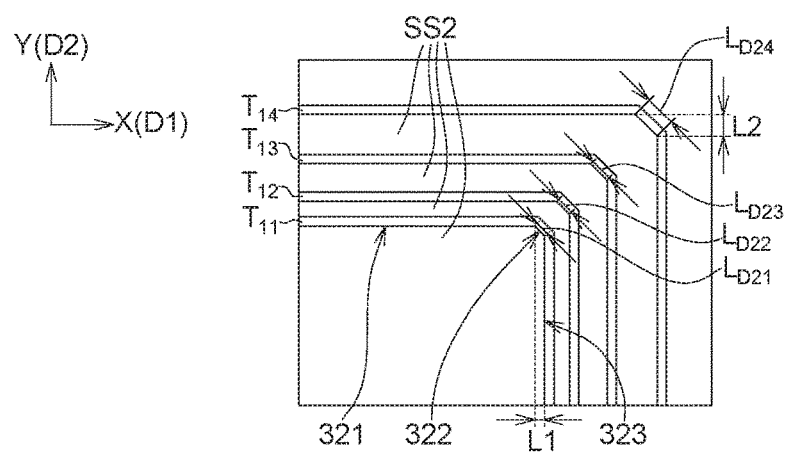
FIG. 11D is an enlarging drawing showing the corners of parts of the dummy islands in FIG. 11B according to the fifth embodiment.

FIG. 11C is a top view of still another 3D semiconductor device according to the fifth embodiment of the present disclosure, which shows the first dummy islands (i.e. SS2) (or the trenches for defining the first dummy islands) in the big-ring region R$_{BR}$, the second dummy islands I$_{dummy2}$ (or the trenches for defining the second dummy islands I$_{dummy2}$) in the isolation region R$_I$ and the third dummy islands I$_{dummy3}$ (or the trenches for defining the third dummy islands I$_{dummy3}$) in the peripheral region R$_{Peri}$ are all arranged as concentric rectangular rings surrounding the array pattern.

FIG. 11C is an enlarging drawing showing the corners of parts of the dummy islands in FIG. 11B according to the fifth embodiment. Similarly, the corners of those dummy islands (or the trenches) can be rounded, or rotated rather than 90 degrees rotation (ex: 45 degrees rotation) to prevent point discharge effect or local high electrical-field. Please refer to the fourth embodiment for the details of arrangements of the corner shapes or trench pitches.

Figure 12A:
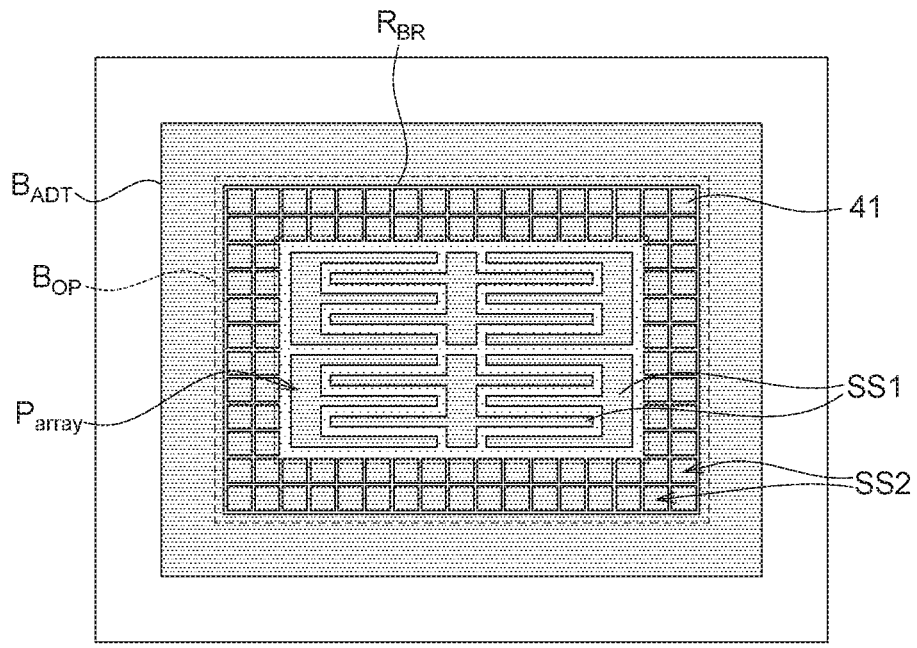
FIG. 12A is a top view of yet another 3D semiconductor device according to the fifth embodiment of the present disclosure.

Besides the concentric rectangular rings or concentric circles, the dummy islands in the second area A2 can be configured as a layout of pads (such as in rectangular shapes, square shapes or other shapes) around the array pattern. FIG. 12A is a top view of yet another 3D semiconductor device according to the fifth embodiment of the present disclosure, which shows the first dummy islands (i.e. SS2) in the big-ring region R$_{BR}$ are configured as a layout of pads (ex: the pads 41) having square shapes for surrounding the array pattern P$_{array}$.

Figure 12B:
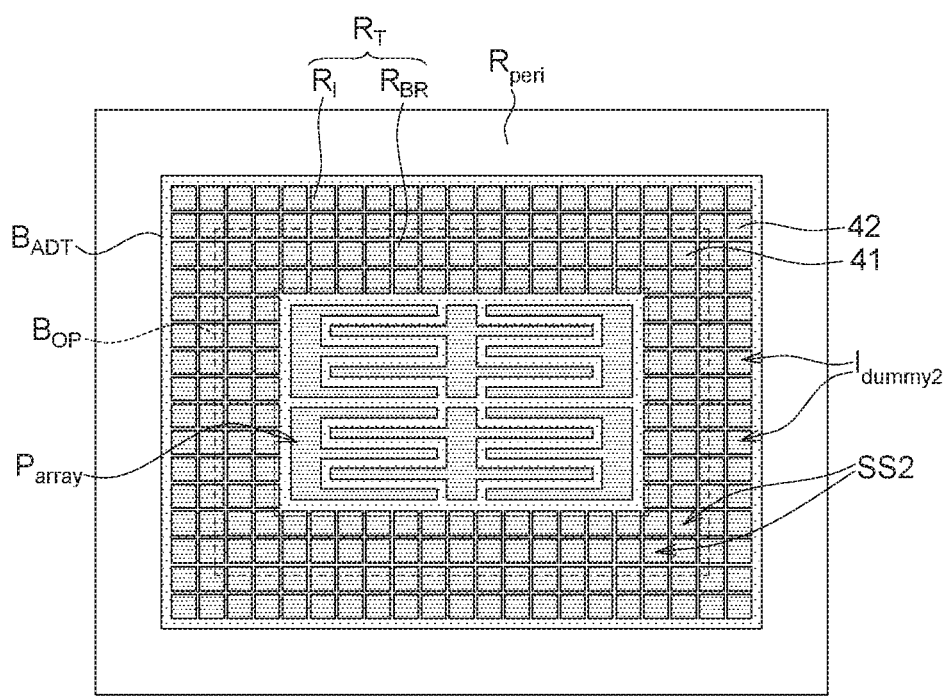
FIG. 12B is a top view of a further 3D semiconductor device according to the fifth embodiment of the present disclosure.

FIG. 12B is a top view of a further 3D semiconductor device according to the fifth embodiment of the present disclosure, which shows the first dummy islands (i.e. 552) in the big-ring region R$_{BR}$ and the second dummy islands I$_{dummy2}$ in the isolation region R$_I$ are configured as a layout of pads having square shapes for surrounding the array pattern P$_{array}$; for example, the pads 41 in the big-ring region R$_{BR}$ and the pads 42 in the isolation region R$_I$.

Figure 12C:
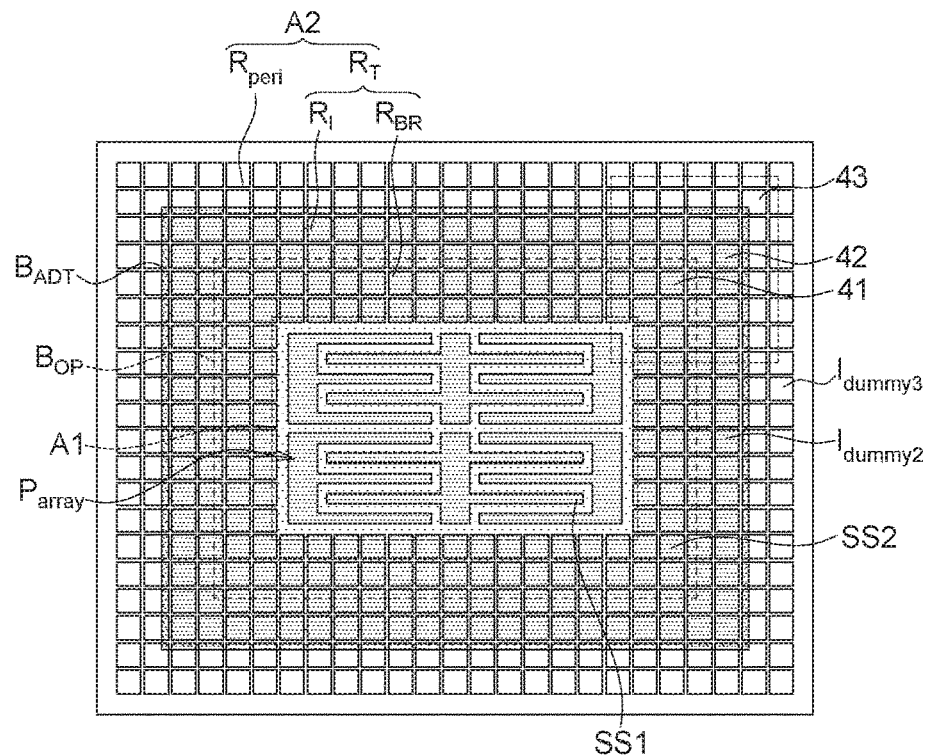
FIG. 12C is a top view of a still further 3D semiconductor device according to the fifth embodiment of the present disclosure.

FIG. 12C is a top view of a still further 3D semiconductor device according to the fifth embodiment of the present disclosure, which shows the first dummy islands (i.e. SS2) in the big-ring region R$_{BR}$, the second dummy islands I$_{dummy2}$ in the isolation region R$_I$ and the third dummy islands I$_{dummy3}$ in the peripheral region R$_{Peri}$ are all configured as a layout of pads having square shapes for surrounding the array pattern P$_{array}$; for example, the pads 41 in the big-ring region R$_{BR}$, the pads 42 in the isolation region R$_I$ and the pads 43 in the peripheral region R$_{Peri}$.

Figure 12D:
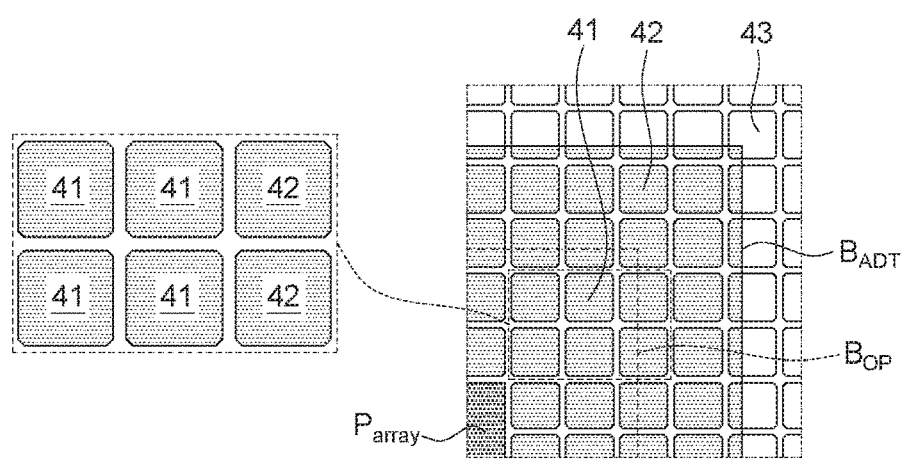
FIG. 12D is an enlarging drawing showing parts of the dummy islands configured as pads in FIG. 12C according to the fifth embodiment.

FIG. 12D is an enlarging drawing showing parts of the dummy islands configured as pads in FIG. 12C according to the fifth embodiment. Similarly, the corners of those dummy pads 41/42(/43) can be rounded, or rotated rather than 90 degrees rotation (ex: 45 degrees rotation) to prevent point discharge effect or local high electrical-field. Please refer to the fourth embodiment for the details of the corner shapes of the dummy pads.

According to the aforementioned descriptions, the 3D semiconductor devices with particular layout designs around an array pattern are provided. A layout design (such as the net-like trench patterns, or the concentric trench patterns, or the all-around-pads pattern) surrounding the array pattern (active region) is proposed to decrease the area of floating conducting layers (ex: polysilicon layers), wherein at least the multilayers extending to the big-ring region $R_{BR}$ are divided into several isolated blocks, such as configured as several dummy islands surrounding the sub-stacks of the array pattern (ex: the patterns shown in FIGS. 3, 4A, 4B, 11A and 12A), thereby greatly decreasing its capacity to store energy or electrical charges. Also, the embodied pattern of trenches or dummy islands can be expanded to the isolation region $R_I$ (ex: the patterns shown in FIGS. 5, 6A, 6B, 11B and 12B), and even further expanded to the peripheral region $R_{Peri}$ (ex: the patterns shown in FIGS. 7, 8A, 8B, 110 and 12C). Thus, the 3D semiconductor device with a pattern of dummy islands of the embodiment effectively reduces the capacities and areas for collecting and gathering undesired electrical charges at the conductive layers during the deep trench etching, no matter how many multilayers (ex: OP layers) stacked for the 3D semiconductor device. Therefore, the arcing effect (ex: particularly at the shape points or edges) could be relaxed; consequently, less damages occur and the electrical characteristics of the 3D semiconductor device in application would be greatly improved.

Other embodiments with different configurations of known elements in the device/apparatus can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor device, comprising:
    a substrate having a first area and a second area, and the second area adjacent to and surrounding the first area, wherein an array pattern is formed in the first area;
    a stack structure having multi-layers formed above the substrate, and the multi-layers comprising active layers alternating with insulating layers above the substrate, the stack structure comprising:
    first sub-stacks related to the array pattern in the first area; and
    second sub-stacks separately disposed in the second area, and the second sub-stacks configured as first dummy islands surrounding the first sub-stacks of the array pattern;
    wherein from a top view, the first dummy islands in the second area are arranged as concentric circles, concentric rectangular rings, or configured as a layout of pads around the array pattern.

2. The 3D semiconductor device according to claim 1, wherein the first dummy islands are separated by first trenches, and pitches between the first trenches are different.

3. The 3D semiconductor device according to claim 2, wherein the pitches between the first trenches are increased with a distance away from the array pattern.

4. The 3D semiconductor device according to claim 1, wherein corners of the first dummy islands have non-right angles.

5. The 3D semiconductor device according to claim 1, wherein one corner of one of the first dummy islands is defined by a first side, a second side and a third side, and the second side is positioned between and connecting the first side and the third side, wherein the first side is perpendicular to the third side, and the second side is tilted to the first side and the third side.

6. The 3D semiconductor device according to claim 5, wherein the second side has a first projection length L1 ranged from 0.1 μm to 100 μm along a direction parallel to the first side, and a second projection length L2 ranged from 0.1 μm to 100 μm along a direction parallel to the third side.

7. The 3D semiconductor device according to claim 1, wherein the second area comprises a big-ring region surrounding the array pattern, and an isolation region surrounding the big-ring region, wherein the big-ring region is positioned between the array pattern and the isolation region, and the second sub-stacks are separately disposed in the big-ring region.

8. The 3D semiconductor device according to claim 7, further comprising second dummy islands disposed above the substrate and positioned in the isolation region ($R_I$), and the second dummy islands surround the first dummy islands.

9. The 3D semiconductor device according to claim 8, wherein the second dummy islands are separated by second trenches, and pitches between the second trenches are different.

10. The 3D semiconductor device according to claim 9, wherein the pitches between the second trenches are increased with a distance away from the array pattern.

11. The 3D semiconductor device according to claim 8, wherein the first dummy islands are separated by first trenches, the second dummy islands are separated by second trenches, and first pitches between the first trenches are smaller than second pitches between the second trenches.

12. The 3D semiconductor device according to claim 8, wherein from the top view, the second dummy islands in the isolation region are arranged as concentric circles, concentric rectangular rings, or a layout of pads around the first dummy islands.

13. The 3D semiconductor device according to claim 8, wherein corners of the second dummy islands have non-right angles.

14. The 3D semiconductor device according to claim 8, wherein the second area further comprises a peripheral region ($R_{Peri}$) surrounding the isolation region ($R_I$), and the isolation region ($R_I$) is positioned between the peripheral region and the big-ring region, wherein the 3D semiconductor device further comprises third dummy islands disposed above the substrate and positioned in the peripheral region, and the third dummy islands surround the second dummy islands.

15. The 3D semiconductor device according to claim 14, wherein the third dummy islands are separated by third trenches, and pitches between the third trenches are different.

16. The 3D semiconductor device according to claim 15, wherein the pitches between the third trenches are increased with a distance away from the array pattern.

17. The 3D semiconductor device according to claim 15, wherein the first dummy islands are separated by first trenches, the second dummy islands are separated by second trenches, wherein first pitches between the first trenches are smaller than second pitches between the second trenches, and the second pitches are smaller than third pitches between the third trenches.

18. The 3D semiconductor device according to claim 14, wherein from the top view, the third dummy islands in the peripheral region are arranged as concentric circles, concentric rectangular rings, or a layout of pads around the second dummy islands.

19. The 3D semiconductor device according to claim 14, wherein corners of the third dummy islands have non-right angles.

* * * * *